United States Patent [19]

Tani et al.

[11] Patent Number: 5,308,929
[45] Date of Patent: May 3, 1994

[54] VIA HOLE STRUCTURE AND PROCESS FOR FORMATION THEREOF

[75] Inventors: Motoaki Tani; Shoichi Miyahara; Makoto Sasaki; Eiji Horikoshi; Isao Kawamura, all of Kawasaki, Japan

[73] Assignee: Fujitsu Limited, Kawasaki, Japan

[21] Appl. No.: 919,909

[22] Filed: Jul. 27, 1992

[30] Foreign Application Priority Data

Aug. 1, 1991 [JP] Japan .................................. 3-192414

[51] Int. Cl.$^5$ ............................................... H05K 1/00
[52] U.S. Cl. .................................... 174/262; 174/266; 361/784
[58] Field of Search ............... 174/262, 263, 264, 265, 174/266, 250; 361/388, 414, 784, 792

[56] References Cited

U.S. PATENT DOCUMENTS

| | | |
|---|---|---|
| 3,348,990 | 10/1967 | Zimmerman et al. . |
| 3,617,613 | 11/1971 | Benzinger et al. . |
| 4,897,627 | 1/1990 | Van Wagener et al. . |
| 4,994,410 | 2/1991 | Sun et al. .............................. 437/192 |
| 5,001,605 | 3/1991 | Savagian et al. ..................... 361/414 |
| 5,028,513 | 7/1991 | Murakami et al. . |
| 5,113,315 | 5/1992 | Capp et al. . |

FOREIGN PATENT DOCUMENTS 2245424 1/1992 United Kingdom .

Primary Examiner—Leo P. Picard
Assistant Examiner—Cheryl R. Figlin
Attorney, Agent, or Firm—Staas & Halsey

[57] ABSTRACT

A via hole structure for interlayer connection formed in an insulating film and a process for the formation of the same. Via holes are formed in an insulating film of a multilayer interconnected board or the like so as to have a shape such that when a metallic film for wiring is formed on the insulating film, the metal film can completely fill up the via holes. The via holes are formed by gradually increasing from the bottom toward the top of an insulating layer 8 the apertures of the via holes 7 formed in the insulating layer 8, comprised of a plurality of insulating resin film or photosensitive insulating resin film layers 2, 5, in a multilayer interconnected board comprising the insulating layer 8 laminated alternately with a wiring layer 13 comprised of an electric conductor.

18 Claims, 9 Drawing Sheets

VIA HOLE STRUCTURE AND PROCESS FOR FORMATION THEREOF

BACKGROUND OF THE INVENTION

1. Field of the Invention

The present invention relates to a via hole structure for interlayer connection formed in an insulating film and a process for the formation thereof. More particularly, in the present invention, fine via holes for interlayer interconnections are formed in a protective film, an interlayer insulating film, or other film of a multilayer interconnection board, a printed circuit for high-density mounting, a printed circuit board, a wiring board, an electronic component, etc. so as to have a shape such that in the subsequent step of depositing a metallic film for wiring, the metallic film can successfully fill up the via holes.

2. Description of the Related Art

In recent years, film of a polyimide resin has attracted attention as an organic insulating film. Although polyimide has heat resistance, an insulating property, and toughness, it does not inherently have a photosensitive property. For this reason, in order to form fine via holes in a polyimide film, it is necessary to use a process wherein etching is conducted through the use of a resist mask. This involves the following troublesome steps.

At the outset, a polyimide precursor to which no photosensitive property has been imparted is coated on a substrate such as a printed circuit board or a silicon wafer by spin coating, spray coating, roll coating, or the like. A photoresist is then coated thereon by the same coating method as that described above. The coatings are prebaked to evaporate the solvent contained in the polyimide precursor or photoresist to form a photosensitive plate. The photosensitive plate is then covered with a photomask having a via hole pattern formed thereon, and light such as an ultraviolet ray is applied from the top of the photomask to perform an exposure. This is then developed, thereby forming a resist pattern corresponding to the via hole pattern. In the development of the photoresist, since the photoresist is usually treated with a solvent, it is necessary to conduct post-baking after the treatment. Then, the resist pattern is used as a mask and subjected to plasma etching and wet etching to etch the polyimide film, thereby forming via holes in the polyimide film. Finally, the photoresist film is peeled off and heat-treated for imidation, thereby forming a polyimide film having via holes formed therein. At the time of the wet etching, since the polyimide film is subjected to isotropic etching, when via holes having a large aspect ratio (thickness of film-/diameter of via hole) are formed, the upper side wall is unfavorably shaved and tapered, which hinders an increase in the density. This is because the taper angle of the wet etching is unconditionally determined and is as small as 40°.

A photosensitive polyimide which enables via holes to be formed without the aid of any photoresist has been developed for the purpose of solving the above problem and reducing the troublesome treatment step. The photosensitive polyimide imparts a photosensitive functional group to a molecule of the polyimide per se, causes an exposed region alone to be photoreacted to make the solubility of the exposed region lower than that of the unexposed region, and causes solely the exposed region, corresponding to the mask pattern, to be left following the development of the polyimide with a solvent. Further, rinsing is conducted through the use of ethyl alcohol or isopropyl alcohol, incapable of dissolving the exposed portion, thereby to completely remove (i.e., any residual dust of incompletely dissolved polyimide) dissolved dust. Finally, heat treatment is conducted to remove the photosensitive functional group having a poor heat resistance through depolymerization, thus causing a polyimide portion having a good heat resistance alone to be left for imidization. The method of introducing the photosensitive functional group varies depending upon the manufacturers of the material. Examples thereof include a covalent bond type and an ionic bond type.

FIG. 9 is a cross-sectional view of a multilayer interconnection board. In the drawing, 1 designates a substrate, 8 an insulating layer, 13 a wiring layer, and 7 a via hole for interlayer interconnection. The thickness of the coating of polyimide per each unit time of coating is as small as about 10 μm, so that in order to impart a satisfactory insulating property to the insulating layer 8, it is necessary to conduct a plurality of recoatings. When a via hole 7 is formed in an insulating layer 8 comprising a plurality of successively coated polyimide film layers, it is useful for the via hole to be normally tapered as shown in FIG. 8(a) from the viewpoint of the formation of a metallic film in the subsequent step. In the case of the dry process, the metallic film for wiring is usually formed by vacuum deposition or sputtering. In this case, when the shape of the via hole is such that the side is vertical as shown in FIG. 8(b) or reversely tapered as shown in FIG. 8(c), it becomes difficult for the metallic film for the wiring to be deposited within the via hole, or there occurs a region within which the metallic film for wiring cannot be completely deposited.

In order to solve this problem, a proposal has been made of the following process for the formation of a via hole.

As shown in FIG. 6(a), a first polyimide film layer 2 is coated on a substrate 1 and subjected to selective exposure and development to form first via holes 4.

Then, as shown in FIG. 6(b), a second polyimide film layer 5 is coated thereon.

Thereafter, as shown in FIG. 6(c), a negative working glass mask 6, on which a pattern of via holes having a larger size than that of the first via holes 4 has been formed, is positioned so that the centers of the holes coincide with those of the first via holes 4, and the assembly is then exposed.

Then, after a development treatment is conducted as shown in FIG. 7(a), a curing treatment is conducted to form via holes 14 wherein the aperture of the via holes in the upper layer is larger than that of the aperture of the via holes in the lower layer as shown in FIG. 7(b).

Although the above-described via holes are widened upward, they are not of a tapered form. This often hinders a metallic film from completely filling up the via holes at the time of the deposition of a metallic film for wiring.

Accordingly, an object of the present invention is to eliminate the above-described drawback and to provide a via hole structure wherein via holes are formed in an insulating film of a multilayer interconnection board or the like so as to have a shape such that a metallic film can completely fill up the via holes when a metallic film for wiring is formed on the insulating film.

SUMMARY OF THE INVENTION

The above-described via hole structure, that is, the first object of the present invention, can be attained by a multilayer interconnection board comprising an insulating layer (8) comprised of a plurality of insulating resin film or photosensitive insulating resin film layers (2, 5) laminated alternating with a wiring layer (13) comprised of an electric conductor, wherein the diameter of the via holes (7), formed in the insulating layer (8) which comprises a plurality of insulating resin film or photosensitive insulating resin film layers (2, 5), is gradually increased from the bottom toward the top of the insulating layer.

The process for the formation of via holes, that is, the second object, can be attained by successively subjecting all of a plurality of insulating resin film or photosensitive insulating resin film layers to the step of forming a first insulating resin film or photosensitive insulating resin film layer (2), forming first via holes (4) in the first insulating resin film or photosensitive insulating resin film layer (2), forming a second insulating resin film or photosensitive insulating resin film layer (5), and forming second via holes (7) having a smaller size than that of the first via holes (4) in the second insulating resin film or photosensitive insulating resin film layer (5) so that the centers of the second via holes (7) coincide with those of the first via holes (4).

BRIEF DESCRIPTION OF THE DRAWINGS

FIGS. 5(a) to 5(e) a cross-sectional views of via holes observed under SEM;

FIGS. 8(a) to 8(e) a cross-sectional views of via holes having various different shapes.

DESCRIPTION OF THE PREFERRED EMBODIMENTS

Figure 1A:
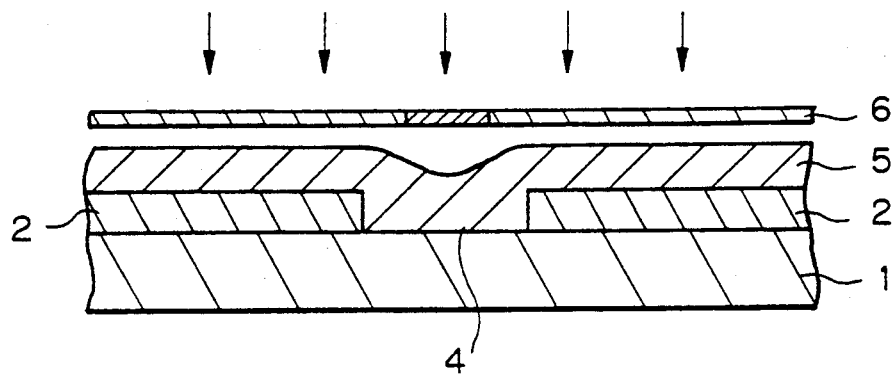
FIGS. 1(a) to 1(c) are effectively a flow diagram of successive stages, in the formation of a structure, for forming via holes according to first and second examples, or embodiments, of the present invention.
Figure 1B:
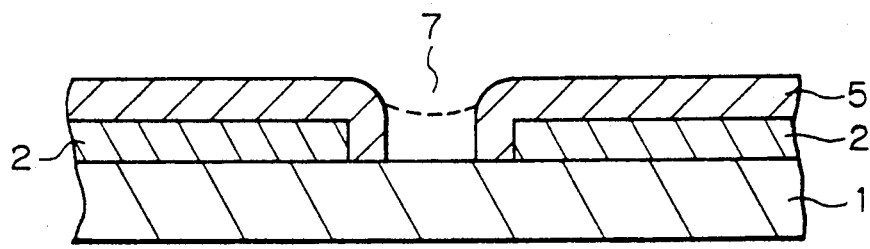
Figure 1C:
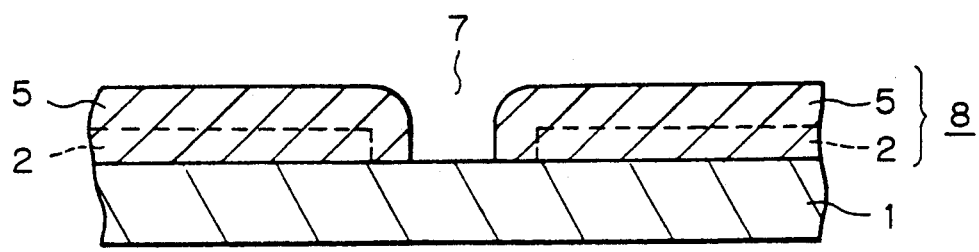

In the via hole structure, e.g., of FIGS. 1(a) to 1(c), it is preferred that the diameter of the upper aperture of the via holes (7) be 300 μm or less and that the insulating resin material or photosensitive insulating resin material comprise a polyimide or a polyimide precursor. A metal film is formed in the via holes (7) by the dry etch process. The thickness of the insulating layer (8) is in the range of from 2 to 100 μm. The via hole structure can be formed in a protective film, an interlayer insulating film, or other film of a multilayer interconnection board, a printed circuit for high-density mounting, a printed circuit board, a wiring board, an electronic component, etc.

In the process for the formation of via holes, the above-described insulating resin film or photosensitive insulating resin film is preferably formed by dissolving a resin insulating material or a photosensitive insulating resin material in at least one solvent and coating the resultant coating solution, e.g., on a main surface of a wafer, or substrate. It is preferred for the insulating resin material or the photosensitive insulating resin material to contain a polyimide or a polyimide precursor. A metallic film is formed in the via holes (7) by the dry process. The thickness of the insulating layer (8) is in the range of from 2 to 100 μm. Further, the use of the above-described process for the formation of via holes enables via holes to be formed in a protective film or an interlayer insulating film of a multilayer interconnection board, a printed circuit for high-density mounting, a printed circuit board, a wiring board, an electronic component, etc.

The present inventors have found that in forming via holes 7 in an insulating layer 8 comprising a plurality of photosensitive insulating resin film layers 2,5, ..., normally tapered via holes, each having an aperture which increases in the direction from the bottom toward the top of the insulating layer can be formed by forming a first photosensitive insulating resin film layer 2, forming first via holes 4 in the first layer, forming a second photosensitive insulating resin film layer 5, and forming second via holes 7 having a smaller size than that of the first via holes 4 so that the centers of the holes 7 coincide with those of the respective first via holes 4. When the photosensitive resin insulating film comprises three layers or more, the above-described step may be successively conducted for upper photosensitive insulating resin film layers. Further, it was experimentally confirmed that the taper angle of the via holes can be freely varied by adjusting the sizes of the via holes respectively formed in the lower, relatively to the upper, photosensitive insulating resin film layers.

It is not always necessary to use a photosensitive insulating resin film, except for the uppermost layer, and instead use may be made of a non-photosensitive insulating resin film. This, however, involves a drawback that the process of forming via holes becomes troublesome. It is also possible to use a non-photosensitive insulating resin film for all the layers including the uppermost layer. In this case as well, the process of forming via holes becomes troublesome and further the shape of the via holes becomes somewhat inferior to the case where use is made of a photosensitive insulating resin film.

EXAMPLES

Three examples of the present invention will now be described with reference to the drawings.

FIRST EXAMPLE

Figure 2A:
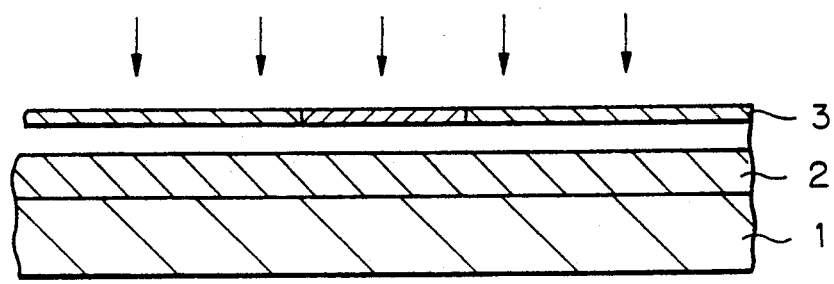
FIGS. 2(a) to 2(c) are effectively a flow diagram of successive stages, in the formation of a structure, for forming via holes according to the first and second examples, or embodiments, of the present invention.

As shown in FIG. 2(a), a first photosensitive polyimide precursor varnish layer 2 (nonvolatile matter: 17.5% by weight) was spin-coated on a 3-in. silicon wafer 1 subjected to a pretreatment and prebaked at a temperature of 110° C. for one hour. The film thickness after prebaking was 14 μm. Then, a negative glass mask 3 having a pattern of via holes having a diameter of 50 μm formed thereon was placed on the silicon wafer 1, which was then irradiated with ultraviolet light having a wavelength of 365 nm at an exposure of 250 mJ/cm².

Figure 2B:
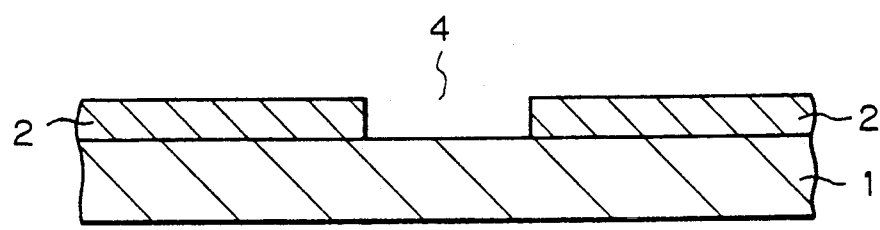

As shown in FIG. 2(b), the exposed film was subjected to ultrasonic development through the use of a N-methyl-2-pyrrolidone solution and rinsed with an ethyl alcohol solution. This caused the exposed pattern regions to be left with the via hole portions, as the unexposed portions, being eluted. Then, the film was semi-cured at a temperature of 200° C. for 30 minutes to form a 10 μm-thick first polyimide film layer 2 having first via holes 4 formed therein.

Figure 2C:
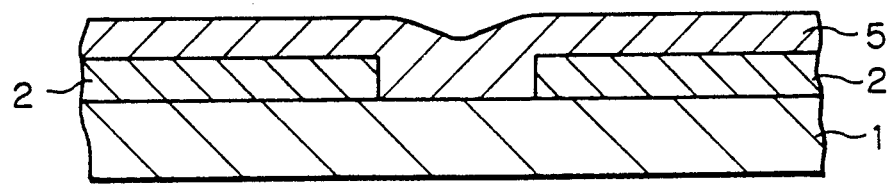

As shown in FIG. 2(c), a second photosensitive polyimide precursor varnish layer 5 was spin-coated thereon and prebaked at a temperature of 110° C. for one hour.

As shown in FIG. 1(a), a negative glass mask 6 having a pattern of via holes having a diameter of 20 μm formed thereon was placed so that the centers coincided with those of the respective, first via holes 4, followed by irradiation with ultraviolet light having a wavelength of 365 nm at an exposure of 350 mJ/cm².

As shown in FIG. 1(b), the exposed film was subjected to ultrasonic development through the use of a N-methyl-2-pyrrolidone solution and rinsed with an ethyl alcohol solution. This caused the exposed pattern regions to be left with the via hole portions, as the unexposed portions, being eluted, thereby forming second via holes 7.

As shown in FIG. 1(c), the film was semi-cured at a temperature of 200° C. for 30 minutes and then at a temperature of 350° C. for 30 minutes to form an insulating layer 8 having a total film thickness of 15 μm, which comprised two polyimide film layers 2,5 having normally tapered via holes 7 formed therein.

Figure 5A:
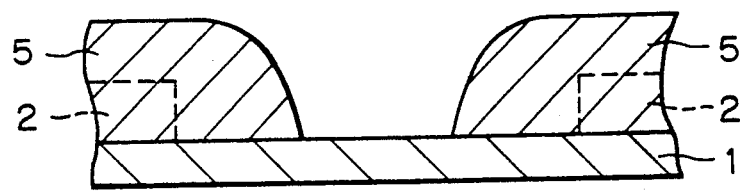

The section of a via hole 7 formed in an insulating layer 8 comprising two polyimide film layers 2,5 was observed under a scanning electron microscope (SEM). As a result, as shown in FIG. 5(a), it was observed that via holes comprising a normally tapered structure having a lower end diameter of 18 μm and an upper end diameter of 45 μm were formed.

A 2 μm-thick copper film and a 2 μm-thick aluminum film (not shown) were formed by sputtering and vacuum deposition, respectively, on the second layer 5 and the section of the film was observed under a scanning electron microscope (SEM). As a result, no breaking of wire was observed.

COMPARATIVE EXAMPLE

For comparison, via holes were formed in the same manner as that of Example 1, except that the aperture of the via holes formed in the first polyimide film layer 2 and the aperture of the via holes formed in the second polyimide film layer were 20 μm and 50 μm, respectively.

The section of a via hole formed in the insulating layer was observed under a scanning electron microscope (SEM). As a result, there was no evidence of the formation of a normally tapered structure. Further, it was observed that the shape of the via holes in the upper layer had a somewhat reversely tapered structure.

Figure 5B:
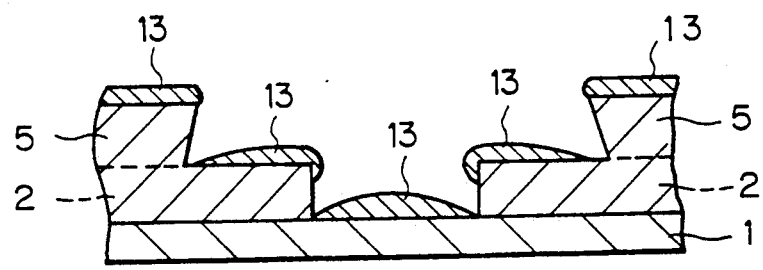

A 2 μm-thick copper film and a 2 μm-thick aluminum film were formed by sputtering and vacuum deposition, respectively, and a section of the film was observed under a scanning electron microscope (SEM). As a result, as shown in FIG. 5(b), in both cases, breaking of wire was observed on the side portion of the via holes.

In the drawing, the copper film or aluminum film is designated by a reference numeral 13.

SECOND EXAMPLE

As shown in FIG. 2(a), a first photosensitive polyimide precursor varnish layer 2 (nonvolatile matter: 14.5% by weight) was spin-coated on a bell-shaped ceramic substrate 1 and prebaked at a temperature of 110° C. for one hour. The film thickness after prebaking was 9 μm. Then, a negative glass mask 3 having a pattern of via holes having a diameter of 60 μm formed thereon was placed on the ceramic substrate, which was then irradiated with ultraviolet light having a wavelength of 365 nm at an exposure of 250 mJ/cm².

As shown in FIG. 2(b), the exposed film was subjected to ultrasonic development through the use of a mixed solution comprising N-methyl-2-pyrrolidone and methyl alcohol and rinsed with an ethyl alcohol solution. This caused the exposed pattern regions to be left with the via hole portions, as the unexposed portions, being eluted. Then, the film was semi-cured at a temperature of 200° C. for 30 minutes to form a 5 μm-thick polyimide film 2 as a first layer having first via holes 4 formed therein.

As shown in FIG. 2(c), a second photosensitive polyimide precursor varnish layer 5 was spin-coated thereon and prebaked at a temperature of 110° C. for one hour.

As shown in FIG. 1(a), a negative glass mask 6 having a pattern of via holes having a diameter of 30 μm formed thereon was placed so that the centers coincided with those of the first via holes 4 having a diameter of 60 μm formed in the first layer, followed by irradiation with ultraviolet light having a wavelength of 365 nm at an exposure of 400 mJ/cm².

As shown in FIG. 1(b), the exposed film was subjected to ultrasonic development through the use of a mixed solution comprising N-methyl-2-pyrrolidone and methyl alcohol and rinsed with an ethyl alcohol solution. This caused the exposed pattern regions to be left with the via hole portions, as the unexposed portions, being eluted, thereby forming second via holes 7.

As shown in FIG. 1(c), the film was semi-cured at a temperature of 200° C. for 30 minutes and then at a temperature of 300° C. for 30 minutes to form an insulating layer 8 having a total film thickness of 10 μm which comprised two polyimide film layers 2,5 having normally tapered via holes 7 formed thereon.

The section of a via hole 7 formed in an insulating layer 8 comprising two polyimide film layers 2,5 was observed under a scanning electron microscope (SEM). As a result, as shown in FIG. 5(a), it was observed that via holes comprising a normally tapered structure having a lower end diameter of 30 μm and an upper end diameter of 50 μm were formed.

A 2 μm-thick copper film and a 2 μm-thick aluminum film (not shown) were formed by sputtering and vacuum deposition, respectively, on the second layer 5 and the section of the film was observed under a scanning electron microscope (SEM). As a result, no breaking of wire was observed.

THIRD EXAMPLE

Figure 3:
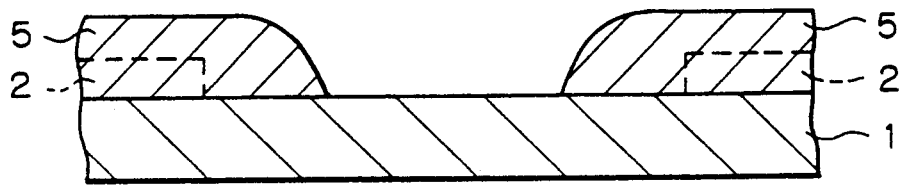
FIGS. 3(a) to 3(c) are effectively a flow diagram of successive stages, in the formation of a structure, for forming via holes according to the third example, or embodiment, of the present invention.
Figure 3:
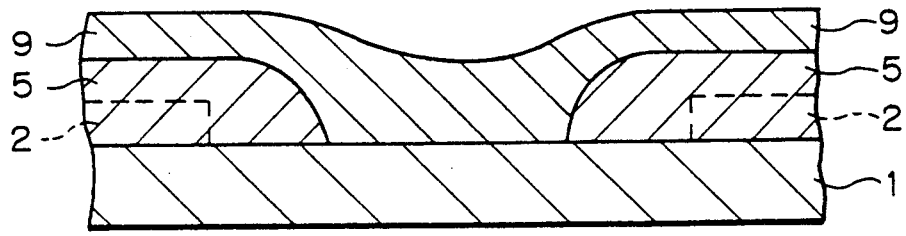
Figure 3:
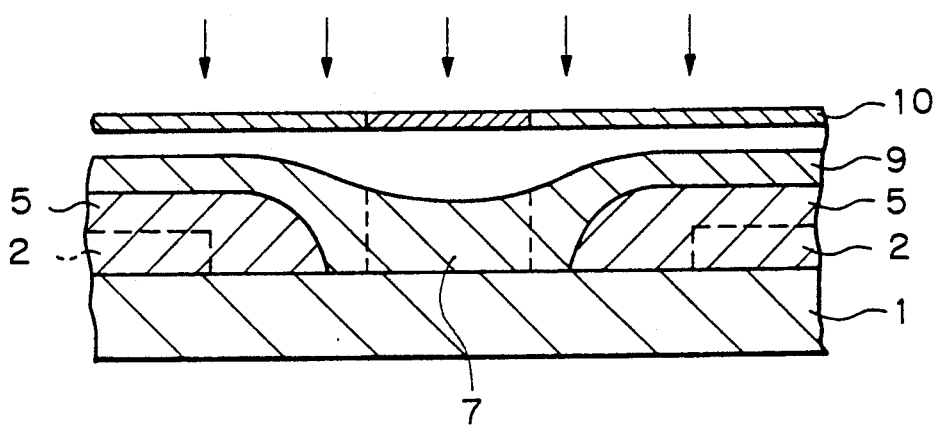

As shown in FIG. 3(b), a third photosensitive polyimide precursor varnish layer 9 was spin-coated on the insulating layer comprising two polyimide film layers 2,5 shown in FIG. 3(a) prepared according to the second example, and prebaked at a temperature of 110° C. for one hour.

As shown in FIG. 3(c), a negative glass mask 10 having a pattern of via holes having a diameter of 20 μm formed thereon was placed so that the centers coincided with those of the via holes 7 having a diameter of 30 μm formed in the second polyimide film layer 5, followed by irradiation with ultraviolet light having a wavelength of 365 nm at an exposure of 400 mJ/cm².

Figure 4:
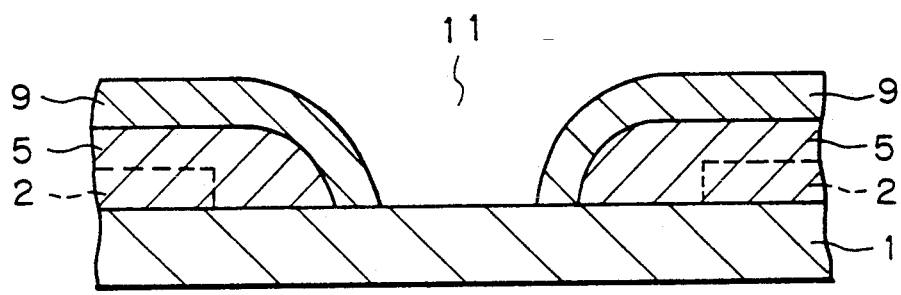
FIGS. 4(a) and 4(b) are effectively a flow diagram of successive stages, in the formation of a structure, for forming via holes according to the third example, or embodiment, of the present invention.
Figure 4:
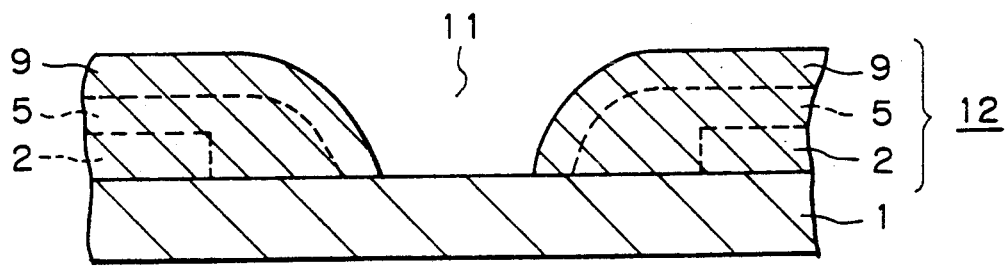

As shown in FIG. 4(a), the exposed film was subjected to ultrasonic development through the use of a mixed solution comprising N-methyl-2-pyrrolidone and methyl alcohol and rinsed with an ethyl alcohol solution. This caused the exposed pattern regions to be left with the via hole portions, as the unexposed portions, being eluted, thereby forming third via holes 11.

As shown in FIG. 4(b), the film was semi-cured at a temperature of 200° C. for 30 minutes and then at a temperature of 300° C. for 30 minutes to form an insulating layer 12 having a total film thickness of 15 μm which comprised three polyimide film layers 2,5,9 having via holes 11 formed therein.

Figure 5C:
Figure 6:
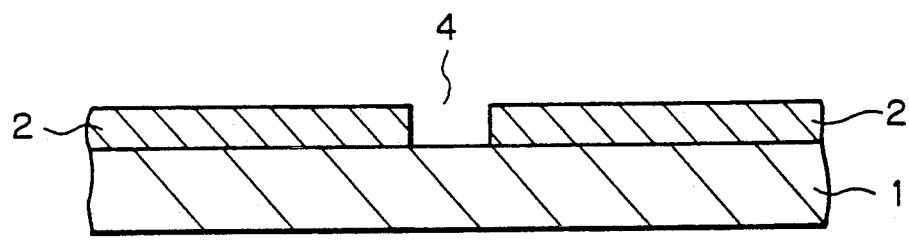
FIGS. 6(a) to 6(c) are effectively a flow diagram of successive stages, in the formation of a structure, for forming via holes according to the prior art.
Figure 6:
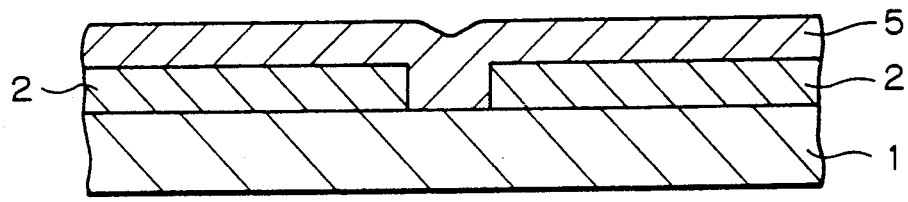
Figure 6:
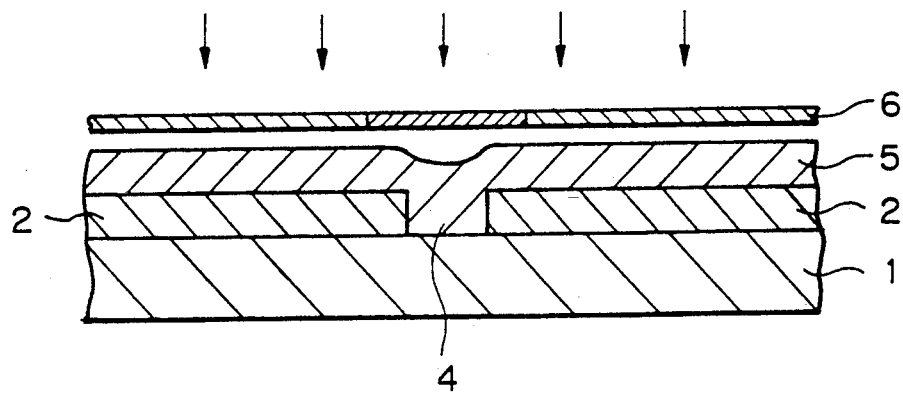
Figure 7A:
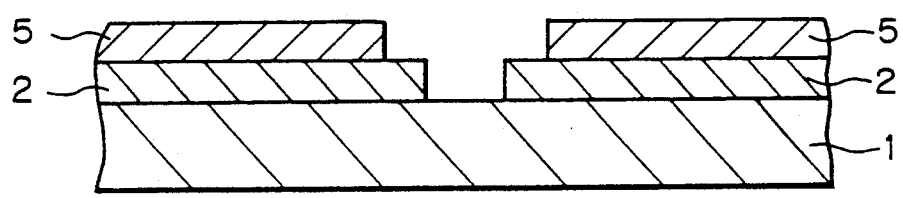
FIGS. 7(a) and 7(b) are effectively a flow diagram of successive stages, in the formation of a structure, (part 2) for forming via holes according to the prior art.
Figure 7B:
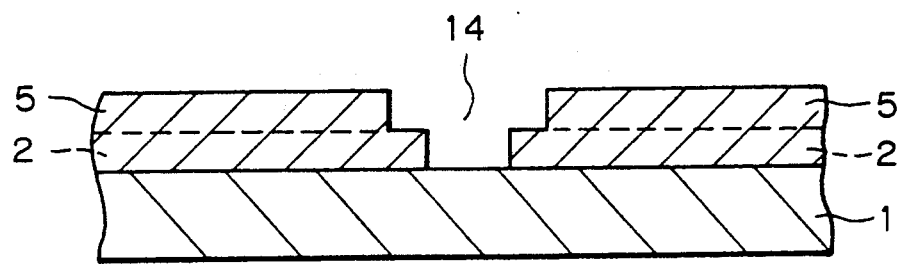
Figure 8A:
Figure 8B:
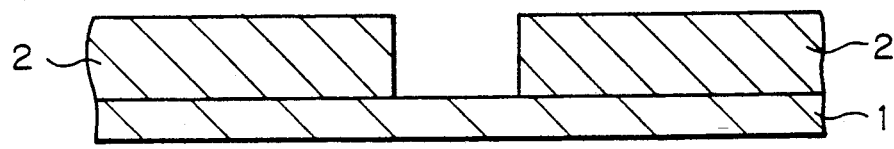
Figure 8C:
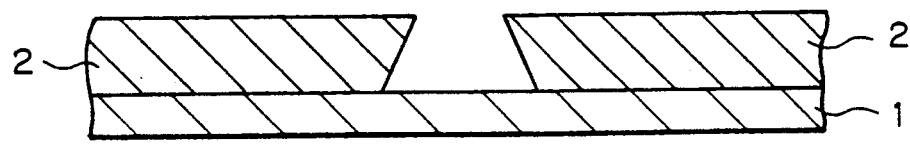
Figure 9:
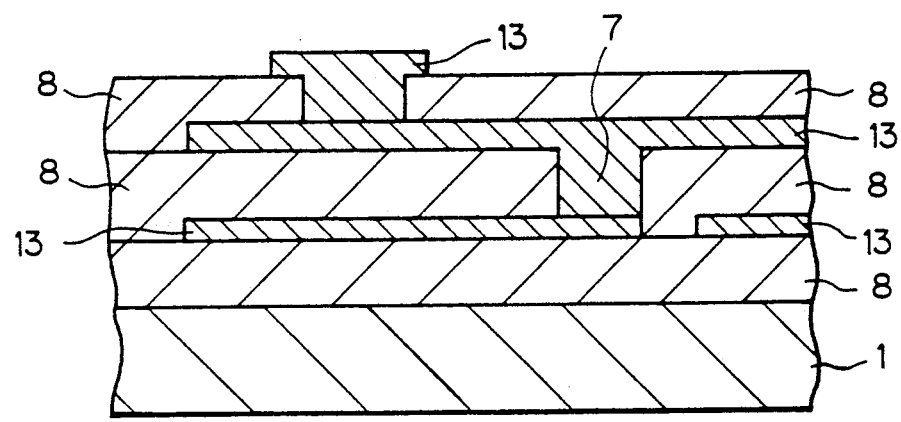
FIG. 9 is a cross-sectional view of a multilayer interconnection board.

The section of a via hole formed in the insulating layer 12 comprising three polyimide film layers 2,5,9 was observed under a scanning electron microscope (SEM). As a result, as shown in FIG. 5(c), it was observed that via holes comprising a normally tapered structure having a lower end diameter of 18 μm and an upper end diameter of 50 μm were formed.

From the above results, it can be easily estimated that when the insulating layer comprises at least three layers, via holes having a normally tapered structure can be formed by making the apertures of via holes formed in the uppermost photosensitive insulating film layer smaller than that of via holes formed in the lower photosensitive insulating film.

As described above, in the via hole structure and the process for the formation thereof according to the present invention, since via holes having a normally tapered structure can be formed by successively forming via holes in a plurality of insulating resin film or photosensitive insulating resin film layers constituting the insulating layer so as to have apertures having a gradually increasing diameter, in the direction from the lower layer toward the upper layer, a metallic film can successfully fill up the via holes at the time of the formation of a metallic film for wiring conducted in a subsequent step, which greatly contributes to an improvement in the reliability of electronic components.

We claim:

1. A multilayer structure having an improved via hole therethrough, comprising:
   a support structure having a main surface;
   a first resin film insulating layer formed on the main surface and having upper and lower surfaces and a first aperture extending therethrough of a first dimension and through which first aperture a corresponding first portion of the main surface of the support structure is exposed; and
   a second resin film insulating layer formed on the upper surface of the first resin film insulating layer and having upper and lower surfaces, a portion of the second resin film insulating layer which corresponds to the first aperture extending into the first aperture and the corresponding lower surface portion thereof being formed on the exposed, first portion of the main surface of the support structure and the corresponding upper surface portion thereof defining a depression relative to the remaining, upper surface of the second insulating layer, the second resin film insulating layer further having a second aperture therein, aligned with the first aperture and being of a second dimension smaller than the first dimension of the first aperture, the second aperture being disposed within the depression in the upper surface of the second insulating layer and extending through the second insulating layer to the main surface of the support structure and through which second aperture a corresponding second portion, smaller than the first portion, of the main surface of the support structure is exposed, the depression in the second insulating layer and the second aperture thereby defining a smoothly tapered via hole extending through the multilayer structure of the first and second insulating layers and having a larger dimension at the upper surface of the second insulating layer than at the main surface of the support structure.

2. A structure as recited in claim 1 wherein the resin material of the first and second insulating layers comprises a photosensitive resin material.

3. A structure as recited in claim 1 wherein the tapered via hole has a diameter at the upper surface of the second insulating layer of 100 μm or less.

4. A structure as recited in claim 1 wherein the resin material of each of the first and second insulating layers comprises polyimide.

5. A structure as recited in claim 1 further comprising a metal film formed on the upper surface of the second insulating layer and extending into and completely filling the tapered via hole.

6. A structure as recited in claim 1 wherein the thickness of each of the first and second insulating layers is in the range of from 2 to 100 μm.

7. A structure as recited in claim 1 wherein the taper angle of the via hole is determined in accordance with the relative relationship of the first and second dimensions of the first and second apertures.

8. A multilayer structure having an improved via hole therethrough comprising:
   a support structure having a main surface;
   plural resin film insulating layers, each having corresponding upper and lower surfaces, comprising a first insulating layer formed on the main surface of the support structure and successive insulating layers, each formed on the upper surface of the respectively next preceding insulating layer; and
   the first and successive insulating layers respectively having first and successive apertures extending therethrough, respectively of first and successively smaller dimensions, and through which corresponding first and successively smaller portions of the main surface of the support structure are exposed, each successive insulating layer having a portion thereof which corresponds to and extends into the aperture of the next preceding insulating layer, the corresponding lower surface portion thereof being formed on the respective, exposed portion of the main surface of the support structure and the corresponding upper surface portion thereof defining a depression relative to the remaining upper surface of the associated insulating layer and the respective aperture thereof being disposed within the corresponding depression, the depression in the last of the successive insulating layers and the respective aperture thereof defining a smoothly tapered via hole extending through the multilayer structure of the first and successive insulating layers and having a larger dimension at the upper surface of the last of the successive insulating layers than at the main surface of the support structure.

9. A structure as recited in claim 8 wherein the resin material of the first and second insulating layers comprises a photosensitive resin material.

10. A structure as recited in claim 8 wherein the tapered via hole has a diameter at the upper surface of the second insulating layer of 100 μm or less.

11. A structure as recited in claim 8 wherein the resin material of each of the first and second insulating layers comprises polyimide.

12. A structure as recited in claim 8 further comprising a metal film formed on the upper surface of the second insulating layer and extending into and completely filling the tapered via hole.

13. A structure as recited in claim 8 wherein the thickness of each of the first and second insulating layers is in the range of from 2 to 100 μm.

14. A structure as recited in claim 8 wherein the taper angle of the via hole is determined in accordance with the relative dimensions of the first and successive apertures respectively in the first and successive insulating layers.

15. A method for forming an improved via hole in a multilayer structure, comprising:
providing a support structure having a main surface;
forming a first resin film insulating layer, having upper and lower surfaces, on the main surface;
forming a first aperture, extending through the first insulating layer, of a first dimension and through which first aperture a corresponding first portion of the main surface of the support structure is exposed;
forming a second resin film insulating layer, having upper and lower surfaces, on the upper surface of the first resin film insulating layer, a portion of the second resin film insulating layer which corresponds to the first aperture extending into the first aperture and the corresponding lower surface portion thereof being formed on the exposed, first portion of the main surface of the support structure and the corresponding upper surface portion thereof defining a depression relative to the remaining, upper surface of the second insulating layer; and
forming a second aperture in the second insulating layer, aligned with the first aperture and of a second dimension smaller than the first dimension of the first aperture, the second aperture being disposed within the depression in the upper surface of the second insulating layer and extending through the second insulating layer to the main surface of the support structure and through which second aperture a corresponding second portion, smaller than the first portion, of the main surface of the support structure is exposed, the depression in the second insulating layer and the second aperture thereby defining a smoothly tapered via hole extending through the multilayer structure of the first and second insulating layers and having a larger dimension at the upper surface of the second insulating layer than at the main surface of the support structure.

16. A method as recited in claim 15 further comprising controlling the taper angle of the via hole in accordance with selecting the relative relationship of the first and second dimensions of the first and second apertures.

17. A method for forming an improved via hole in a multilayer structure, comprising:
providing a support structure defining a main surface;
forming a first resin film insulating layer, having upper and lower surfaces, on the main surface; and
forming successive insulating layers, each having corresponding upper and lower surfaces and an aperture extending therethrough, the successive insulating layers having respective apertures of successively smaller dimensions than the first dimension of the first aperture and through which corresponding, successively smaller portions of the main surface of the support structure are exposed, each successive insulating layer having a portion thereof which corresponds to and extends into the aperture of the next preceding insulating layer, the corresponding lower surface portion thereof being formed on the respective, exposed portion of the main surface of the support structure and the corresponding upper surface portion thereof defining a depression relative to the remaining upper surface of the associated insulating layer, and the respective aperture thereof being disposed within the corresponding depression, the depression in the last of the successive insulating layers and the respective aperture thereof defining a tapered via hole extending through the multilayer structure of the first and successive insulating layers and having a larger dimension at the upper surface of the last of the successive insulating layers than at the main surface of the support structure.

18. A method as recited in claim 17, further comprising adjusting the taper angle of the via hole in accordance with selecting the relative dimensions of the first and successive apertures in the respective, first and successive insulating layers.

* * * * *

UNITED STATES PATENT AND TRADEMARK OFFICE
CERTIFICATE OF CORRECTION

PATENT NO. : 5,308,929
DATED : May 3, 1994
INVENTOR(S) : Motoaki TANI et al.

It is certified that error appears in the above-indentified patent and that said Letters Patent is hereby corrected as shown below:

Col. 1, line 48, change "imidation" to --imidization--.

Col. 2, line 4, after "remove" insert --any dissolved dust--;
line 5, delete "dissolved dust".

Col. 3, line 47, change "a" to --are--;
line 55, change "a" to --are--.

Signed and Sealed this

Fourth Day of October, 1994

Attest:

BRUCE LEHMAN

*Attesting Officer*    *Commissioner of Patents and Trademarks*